United States Patent [19]
Cockrum et al.

[11] Patent Number: 5,936,268
[45] Date of Patent: Aug. 10, 1999

[54] EPITAXIAL PASSIVATION OF GROUP II-VI INFRARED PHOTODETECTORS

[75] Inventors: Charles A. Cockrum; Peter R. Bratt, both of Goleta; David R. Rhiger, Santa Barbara; Owen K. Wu, Thousand Oaks, all of Calif.

[73] Assignee: Raytheon Company, Lexington, Mass.

[21] Appl. No.: 07/174,745

[22] Filed: Mar. 29, 1988

[51] Int. Cl.⁶ .................. H01L 31/0328; H01L 31/00
[52] U.S. Cl. .................. 257/188; 257/189; 257/201; 257/442; 257/443; 257/447
[58] Field of Search .................. 357/30 B, 30 H, 357/30 P, 30 E, 16, 32, 56, 55, 52, 52 C, 52 T; 257/188, 189, 201, 442, 443, 447

[56] References Cited

U.S. PATENT DOCUMENTS

| | | | |
|---|---|---|---|
| 3,845,494 | 10/1974 | Ameurlaine et al. | 357/30 B |
| 3,988,774 | 10/1976 | Cohen-Solal et al. | 357/58 |
| 4,132,999 | 1/1979 | Maille et al. | 357/30 |
| 4,137,544 | 1/1979 | Koehler | 357/30 B |
| 4,357,620 | 11/1982 | Wang et al. | 357/16 |
| 4,376,659 | 3/1983 | Castro | 357/16 X |
| 4,553,152 | 11/1985 | Nishitani | 357/30 B |
| 4,639,756 | 1/1987 | Rosbeck et al. | 357/30 |

FOREIGN PATENT DOCUMENTS

| | | | |
|---|---|---|---|
| 0603165 | 1/1985 | Japan | 357/30 B |
| 2100927 | 1/1983 | United Kingdom | 357/30 B |

OTHER PUBLICATIONS

Chu et al, "High Performance Backside–Illuminated $Hg_{0.78}Cd_{0.22}Te/Cdte$ ($\lambda_{co}$=10 $\mu$m) Planar Diodes," Appl. Phys. Lett. 37(5), Sep. 1, 1980, pp. 486–488.

*Primary Examiner*—Stephen C. Buczinski
*Attorney, Agent, or Firm*—W. C. Schubert; G. H. Lenzen, Jr.

[57] ABSTRACT

An array 1 of photodiodes 2 is comprised of a Group II–VI material, such as HgCdTe, which may be selectively doped to form a plurality of diode junctions. Array 1 is comprised of a plurality of photodiodes 2 which are disposed in a regular, two dimensional array. Incident IR radiation, which may be long wavelength, medium wavelength or short wavelength (LWIR, MWIR or SWIR) radiation, is incident upon a surface of the array 1. The array 1 comprises a radiation absorbing base layer 3 of $Hg_{1-x}Cd_xTe$ semiconducting material, the value of x determining the responsivity of the array to either LWIR, MWIR or SWIR. Each of the photodiodes 2 is defined by a mesa structure, or cap layer 3; or the array 1 of photodiodes 2 may be a planar structure. Each of the photodiodes 2 is provided with an area of contact metallization 4 upon a top surface thereof, the metallization serving to electrically couple an underlying photodiode to a readout device. The upper surface of the array 1 is provided with, in accordance with the invention, a passivation layer 5 comprised of an epitaxial layer of Group II–VI material which forms a heterostructure with the underlying Group II–VI material and which has a wider bandgap than the underlying $Hg_{(1-x)}Cd_xTe$, thereby beneficially repelling both holes and electrons from the diode junctions.

30 Claims, 8 Drawing Sheets

INCIDENT INFRARED RADIATION hυ

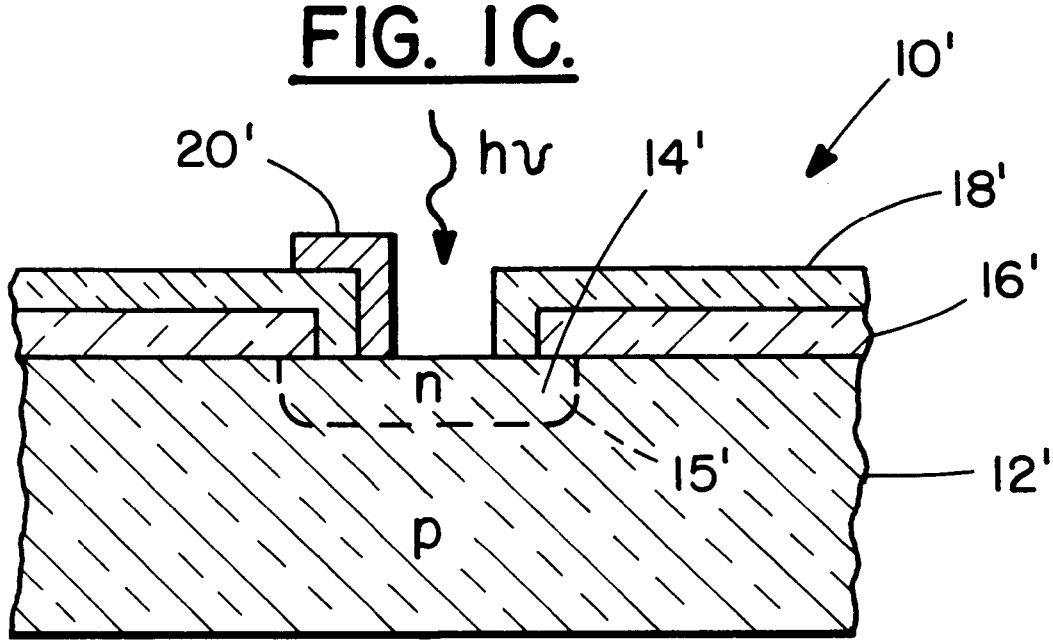

AVERAGE $R_0A_0$ AT 80K = 8.5 $\Omega$-cm$^2$

DIFFUSION LIMITED TO ≈ 65K

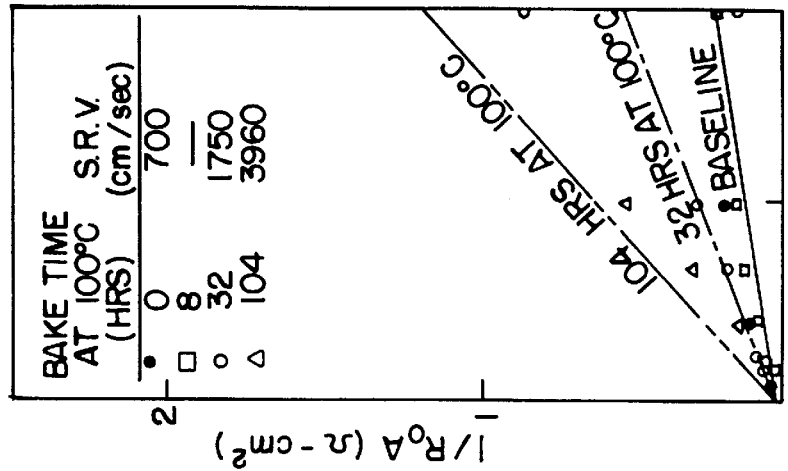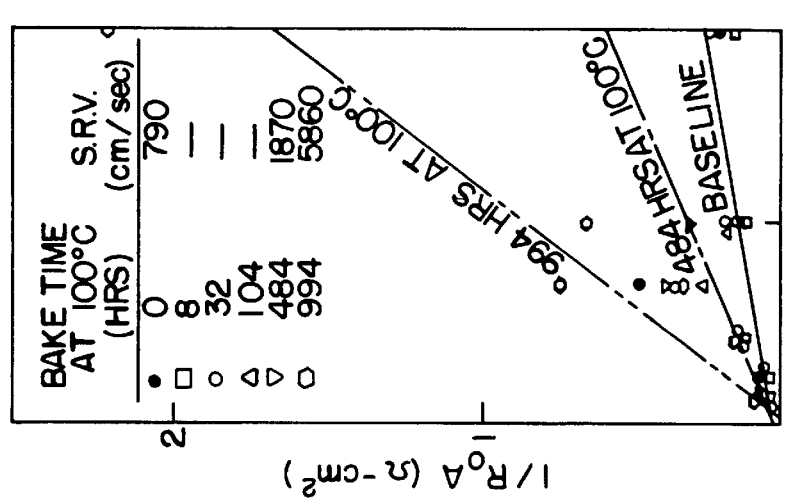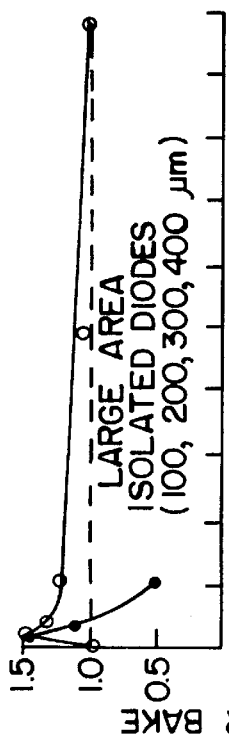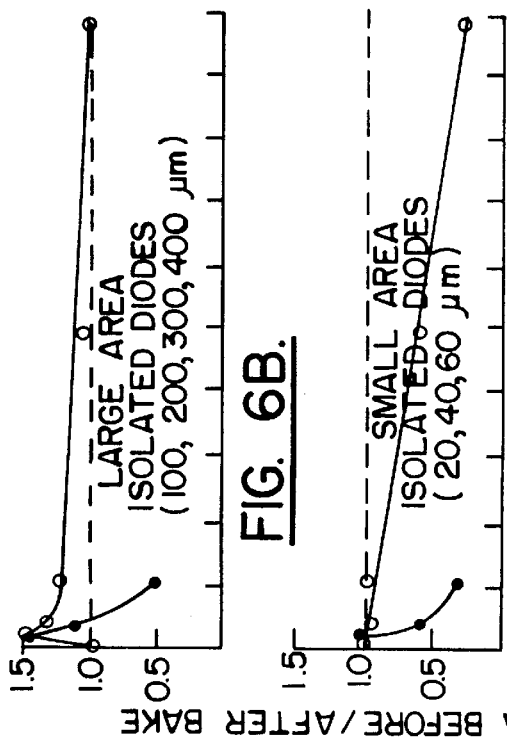

EPITAXIAL PASSIVATION OF GROUP II-VI INFRARED PHOTODETECTORS

FIELD OF THE INVENTION

This invention relates generally to Group II–VI infrared (IR) photodetectors and, in particular, to a HgCdTe IR photodetector which has an epitaxially grown, wider bandgap passivation layer comprised of, for example, CdTe or CdZnTe.

BACKGROUND OF THE INVENTION

Mercury—cadmium—telluride ($Hg_{(1-x)}Cd_xTe$, where x may equal substantially zero to 1.0) photodiodes are typically fabricated as two dimensional arrays and include a layer of passivation applied to an upper surface of the array, the passivation layer comprising low-temperature photochemical $SiO_2$, evaporated ZnS, or anodically grown CdS. While suitable for some imaging applications it has been found that during certain subsequent processing steps of the array, such as a 100° C., high vacuum bake cycle required to outgas a vacuum Dewar which houses the photodiode array, that such a conventional passivation layer may be disadvantageous. For example, there has been observed a degradation in critical performance parameters such as leakage current, diode impedance, quantum efficiency, noise (especially at low frequencies), spectral response, and optical area. This degradation is especially evident in long-wavelength detectors. Porosity of the passivation layer and lack of adhesion to the underlying HgCdTe surface are also common problems observed with the aforedescribed conventional passivation layers.

Furthermore, inasmuch as these conventional passivation materials form no more than a coating upon the HgCdTe surface, control over the HgCdTe/passivation interface band structure or energy levels is difficult or impossible to achieve. It is therefore necessary that these passivation materials both create and maintain flatband conditions at the HgCdTe/passivation interface if the array is to maintain a desired level of performance parameters, especially during and after high temperature processing and storage.

SUMMARY OF THE INVENTION

The foregoing problems are overcome and other advantages are realized by an IR photodiode and an array of same constructed in accordance with the method and apparatus of the invention having a first, radiation absorbing, region for generating charge carriers from absorbed radiation, the radiation absorbing region comprising a Group II–VI material which has a first type of electrical conductivity; a second region in contact with the first region, the second region also comprising a Group II–VI material which has an opposite type of electrical conductivity from the first region for forming a p-n diode junction; and a third region overlying at least the p-n diode junction at the interface of the first and the second regions, the third region also comprising a Group II–VI material and forming a heterostructure with the underlying material. The first and the second regions may have similar or dissimilar energy bandgaps and the third region has an energy bandgap which is wider than that of either the first or second regions.

In accordance with preferred embodiments of the invention the third region comprises an epitaxial passivation layer comprised of CdTe, CdZnTe or wider bandgap HgCdTe; the CdZnTe and HgCdTe further being lattice matched with the underlying Group II–VI semiconductor material which is comprised of HgCdTe. An optional overglass layer may be provided upon the passivation layer, the overglass layer supplementing the effect of the epitaxial passivation layer to inhibit the out-diffusion of Hg during exposure to elevated temperature and also to electrically insulate the photodiode contacts one from another.

BRIEF DESCRIPTION OF THE DRAWING

These and other aspects of the invention will be made more apparent in the following Detailed Description of Preferred Embodiments read in conjunction with the accompanying Drawing wherein;

FIG. 1c is a cross-sectional view of a top side illuminated planar photodiode 10' having a p-type HgCdTe radiation absorbing base layer 12', an n-type region 14' and a CdTe, CdZnTe or HgCdTe passivation layer 16'.

FIGS. 6a–6c show a comparison of the $R_oA$ product as a function of storage temperature at 100° C. for CdTe and conventional $SiO_2$ LWIR large area, small area and 5×5 arrays, respectively, of HgCdTe photodiodes; and FIGS. 7a and 7b show a comparison of surface recombination velocity (SRV) as a function of bake time at 100° C. for CdTe passivated and conventional $SiO_2$ passivated photodiodes, respectively.

DETAILED DESCRIPTION OF PREFERRED EMBODIMENTS

Although the invention will be described in the context of a backside illuminated, mesa-type photovoltaic radiation detector it should be realized that the teachings of the invention also apply to photoconductive and to frontside illuminated radiation detectors. The invention is also applicable to either homojunction or heterojunction devices. The invention further encompases planar types of detectors wherein a base layer has regions, or "wells", of an opposite type of conductivity formed within an upper surface thereof; the interface between the base layer and each region defining the p-n diode junction.

Figure 1A:
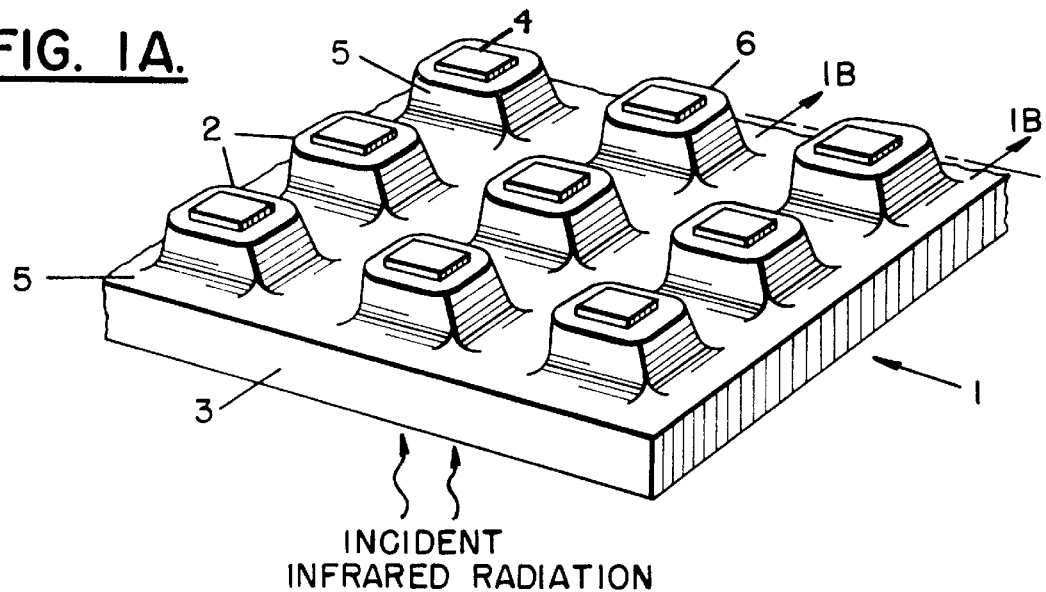
FIG. 1a is a stylized perspective view, not to scale, of a portion of an array 1 of Group II–VI photodiodes 2 having, in accordance with the invention, an epitaxial passivation layer 5 which is comprised of Group II–VI material.

Referring first to FIG. 1a there is shown a stylized elevational view of a portion of an array 1 of photodiodes 2, the view not being to scale. The photodiodes are comprised of a Group II–VI material, such as HgCdTe, which are each selectively differentiated by conductivity type to form a plurality of diode junctions. Array 1 can be seen to be comprised of a plurality of photodiodes 2 which are disposed in a regular, two dimensional array. Incident IR radiation, which may be long wavelength, medium wavelength or short wavelength (LWIR, MWIR or SWIR) radiation, is incident upon a bottom surface of the array 1. The array 1 comprises a radiation absorbing base layer 3 of $Hg_{1-x}Cd_xTe$ semiconductor material, the value of x determining the response of the array to either LWIR, MWIR or SWIR. Each of the photodiodes 2 is defined by a mesa structure 6 which are typically formed by etching intersecting V-shaped grooves through an overlying cap layer and into the base layer. Each of the photodiodes 2 is provided with an area of contact metallization 4 upon a top surface thereof, the metallization serving to electrically couple an underlying photodiode to a readout device (not shown) typically via an indium bump (not shown). The upper surface of the array 1 is also provided with, in accordance with the invention, a passivation layer 5 comprised of an epitaxial layer of Group II–VI material which forms a heterostructure with the underlying Group II–VI material.

Figure 1B:
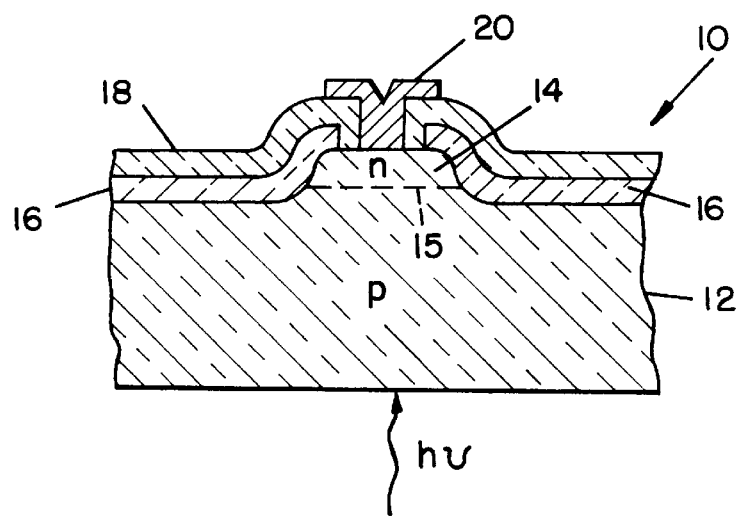
FIG. 1b is a cross-sectional view of a photodiode 10 having a HgCdTe radiation absorbing base layer 12, a HgCdTe cap layer 14 and a CdTe, CdZnTe or HgCdTe passivation layer 16.

Referring now to FIG. 1b there is shown in cross-section one of the photodiodes of array 1, specifically a double layer HgCdTe heterojunction photodiode 10 having a bottom surface for admitting infrared radiation, indicated by the arrow designated hv. If desired, photodiode 10 may be a homojunction type device. Photodiode 10 comprises a base layer 12 wherein the incident radiation is absorbed, thereby generating charge carriers. The radiation absorbing base layer 12 may be either p-type or n-type semiconductor material and has a cap layer 14 which has an opposite type of conductivity for forming a p-n junction 15. Thus, if the radiation absorbing base layer 12 is p-type HgCdTe the cap layer 14 is n-type HgCdTe. Charge carriers generated by the absorption of IR radiation result in a current flow across the junction 15, this current flow being detected by a readout circuit (not shown) which is coupled to the photodiode 10.

For example, the base layer 12 may be p-type and may be doped with arsenic to a concentration of approximately $5 \times 10^{15}$ to approximately $5 \times 10^{16}$ atoms/cm$^3$. The cap layer 14 may be intrinsically n-type or may be made n-type by doping with indium to a concentration of approximately $10^{16}$ to approximately $10^{17}$ atoms/cm$^3$.

In accordance with one preferred embodiment of the invention at least the p-n diode junction 15 region of the photodiode 10 is passivated with a relatively thin epitaxial layer 16 of cadmium-telluride (CdTe), the passivation layer 16 having a typical thickness of approximately 5000 angstoms.

In accordance with another preferred embodiment of the invention, the passivation layer 16 is comprised of an epitaxial layer of cadmium-zinc-telluride $(Cd_{(1-y)}Zn_yTe)$ which may also have a typical thickness of approximately 5000 angstroms.

In accordance with still another preferred embodiment of the inveniton the passivaton layer 16 is comprised of an epitaxial layer of $Hg_{(1-x)}Cd_xTe$ wherein the value of x is selected to cause the epitaxial layer to have a wider bandgap than the underlying base and cap layers 12 and 14, respectively.

Figure 2:
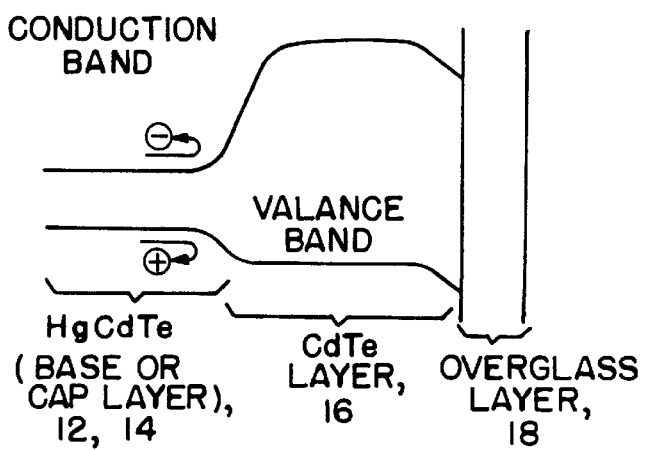
FIG. 2 is a representative energy band gap diagram of the epitaxially passivated photodiode of FIG. 1b.
Figure 3A:
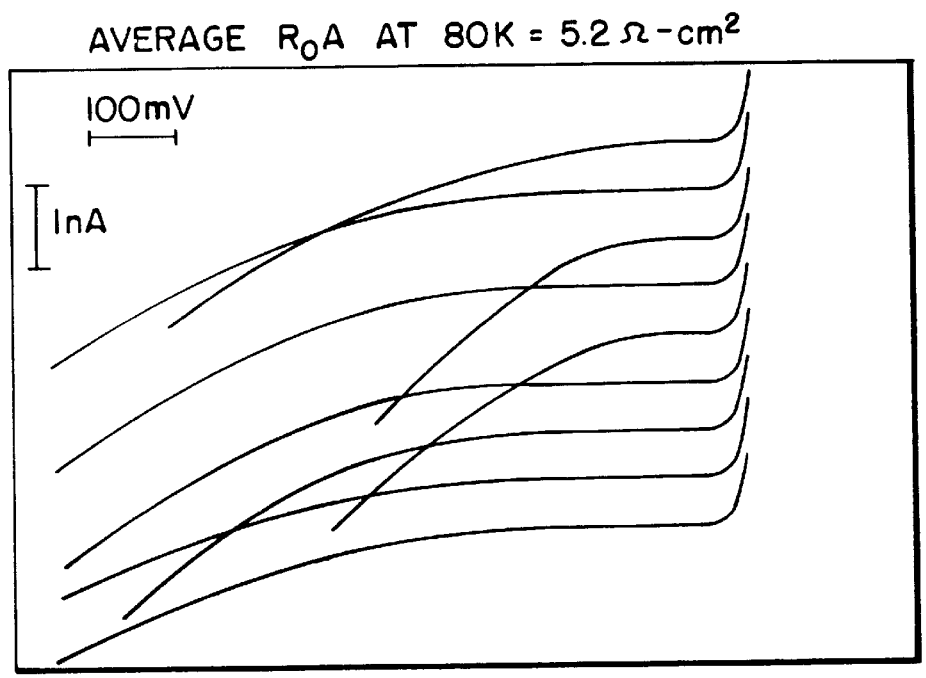
FIGS. 3a–3d are performance curves of a CdTe passivated LWIR HgCdTe photodiode showing representative I–V curves at 80K, $R_oA$ vs. temperature, spectral response and a noise spectrum, respectively.
Figure 3B:
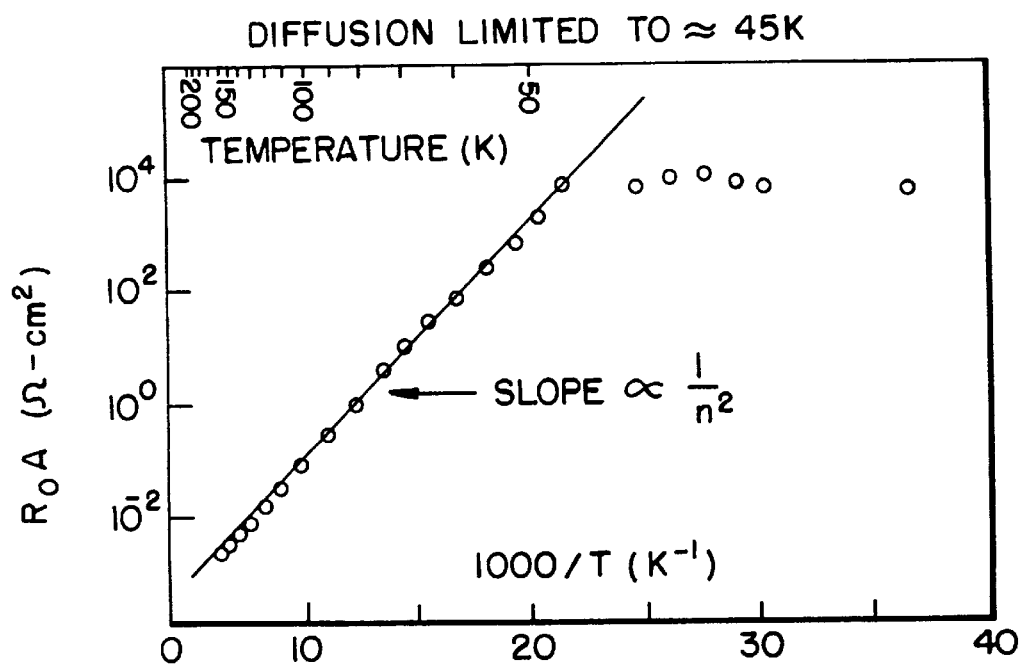
Figure 3C:
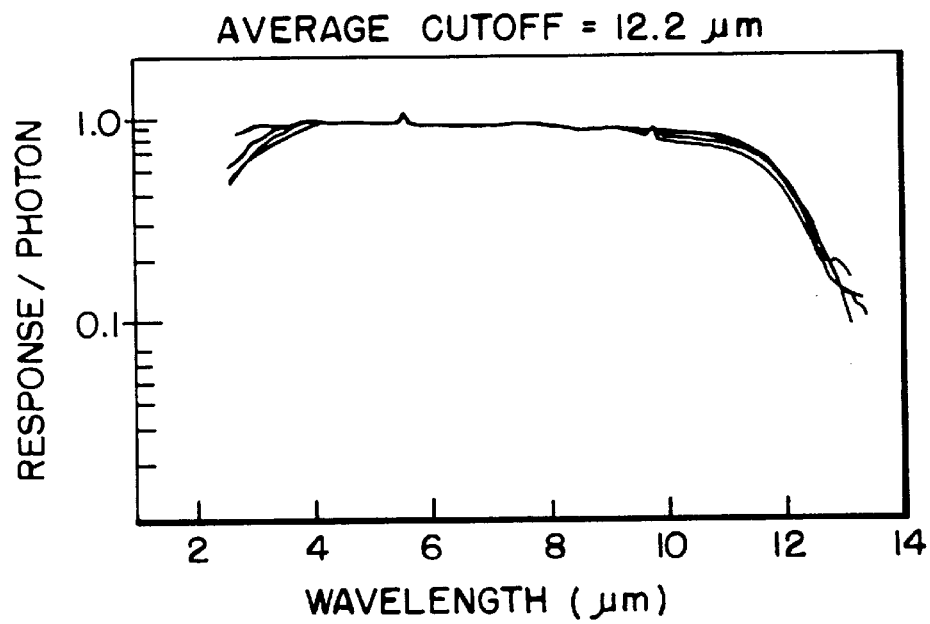
Figure 3D:
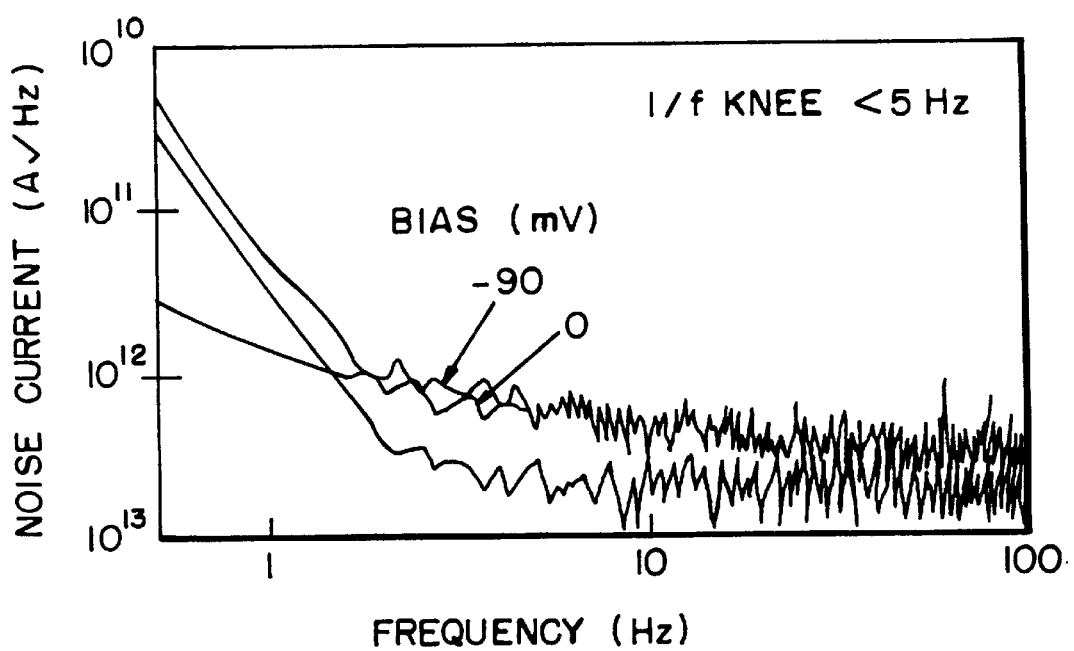
Figure 4A:
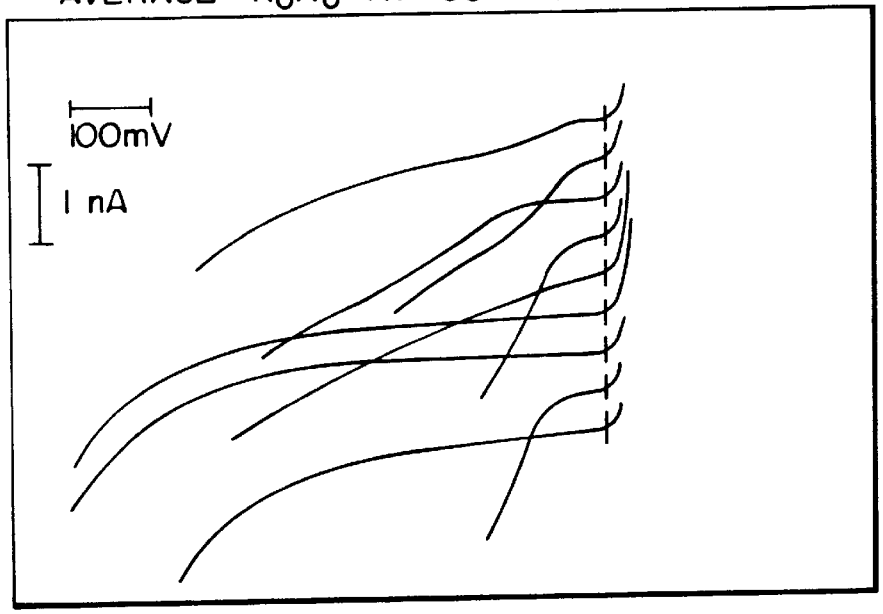
FIGS. 4a–4d shows a corresponding set of performance curves for a $SiO_2$ passivated LWIR HgCdTe photodiode of the prior art.
Figure 4B:
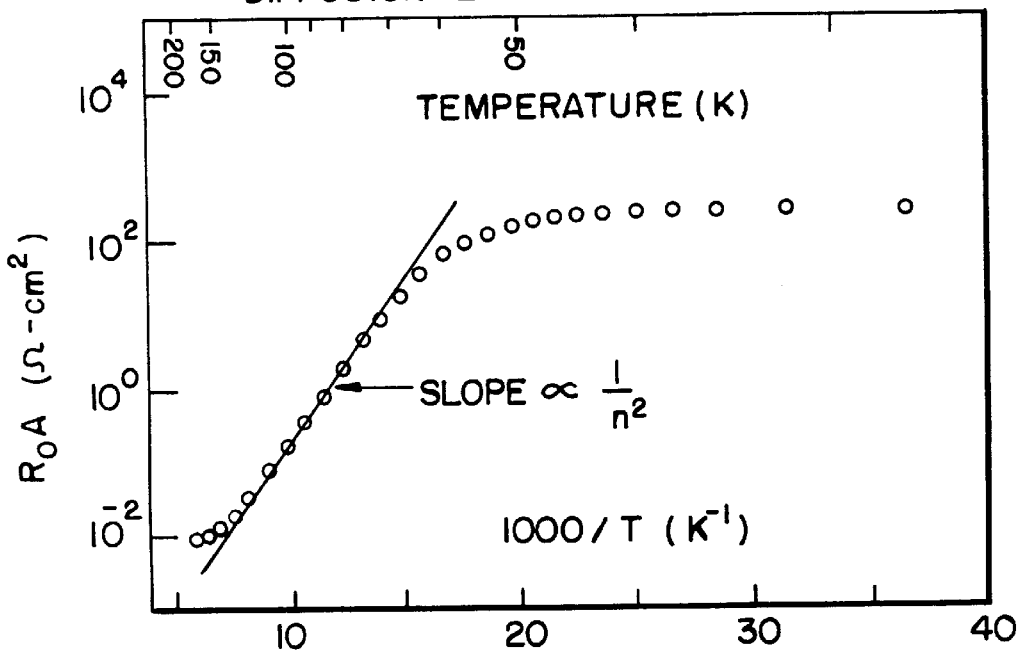
Figure 4C:
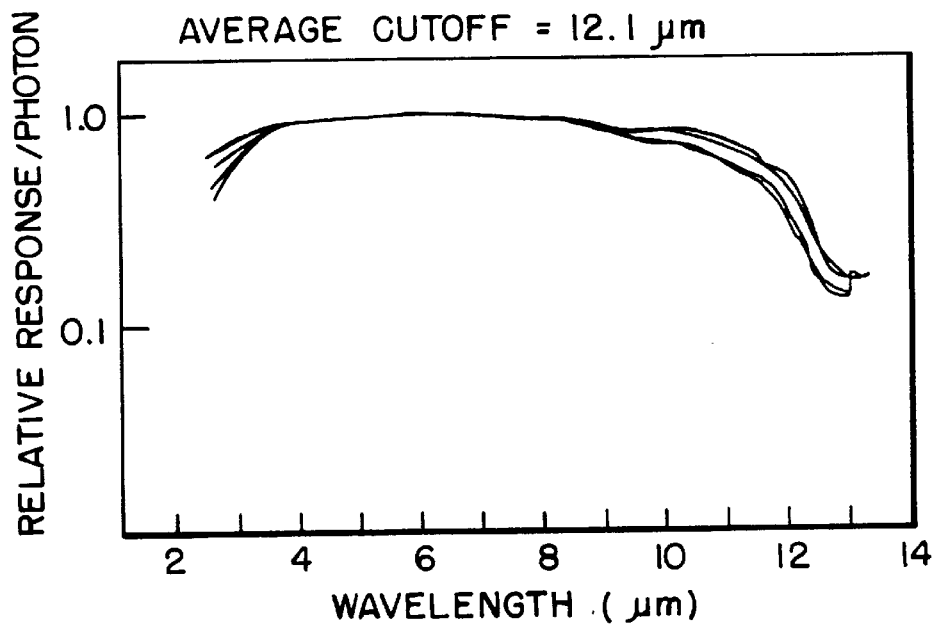
Figure 4D:
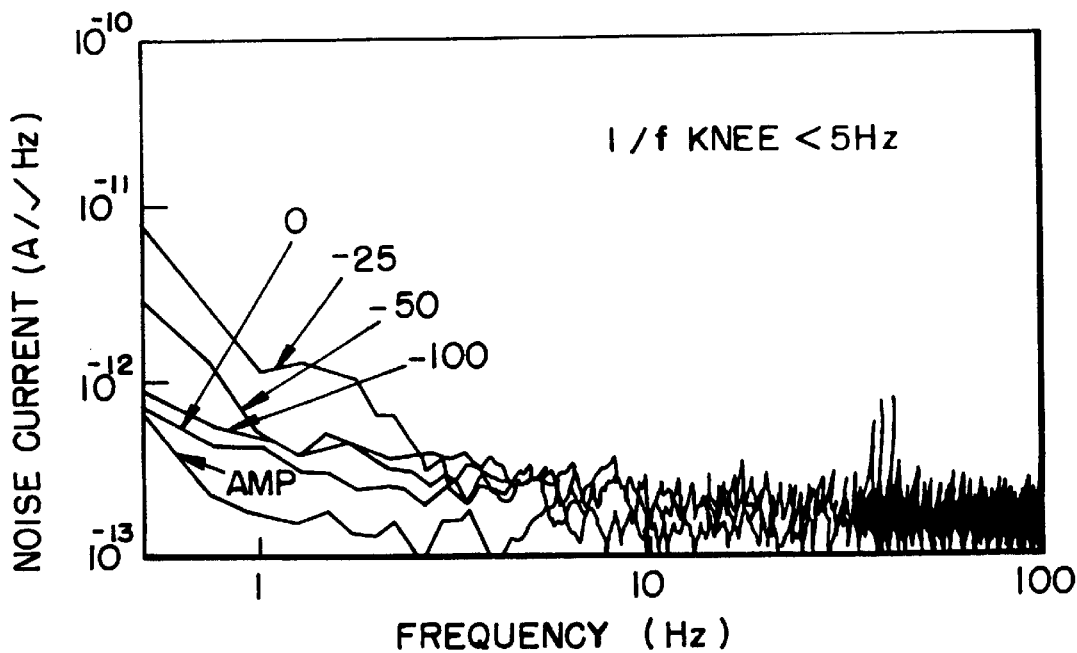
Figure 5A:
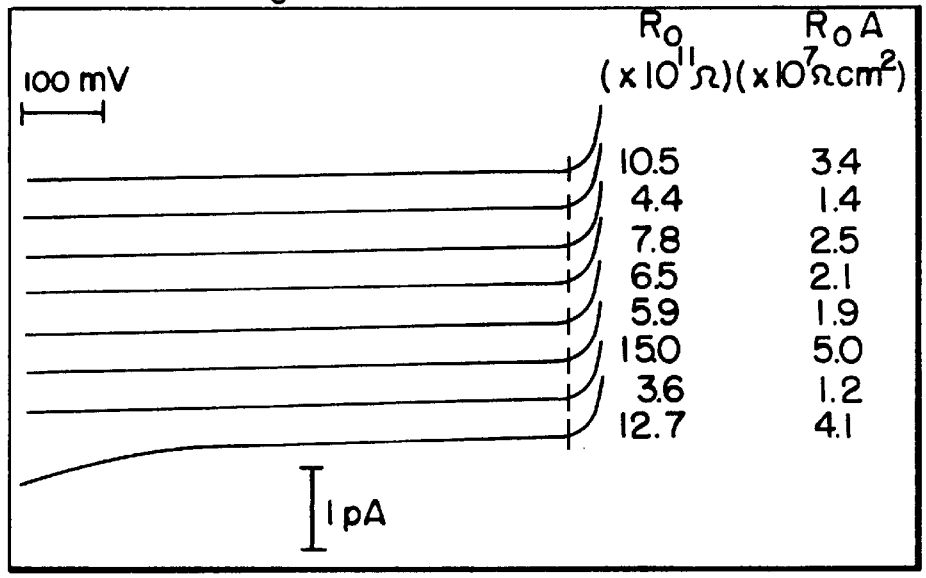
FIGS. 5a and 5b show a comparison of I–V curves for a CdTe passivated and a conventional $SiO_2$ passivated MWIR photodiode, respectively, both being fabricated from different portions of the same HgCdTe wafer.
Figure 5B:
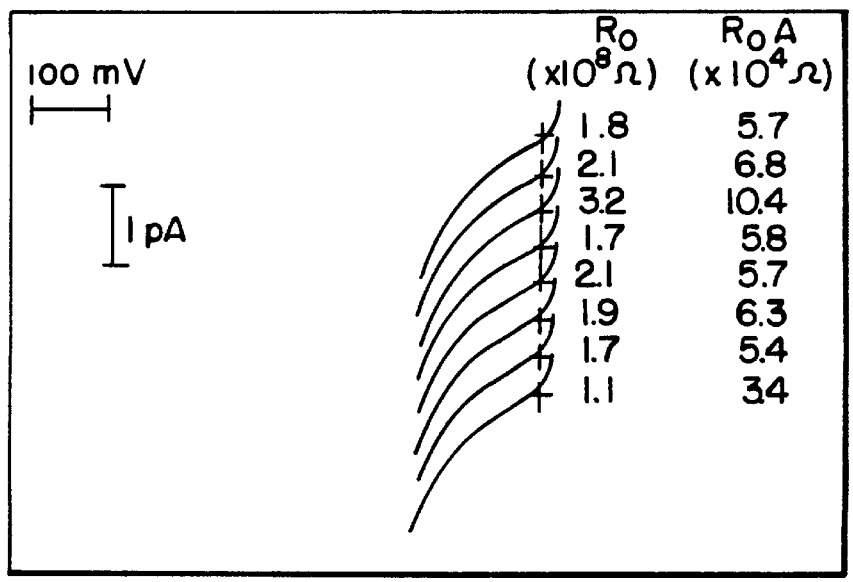

It can be seen that in these preferred embodiments of the invention that the base and cap layers 12 and 14 and also the passivation layer 16 are members of the II–VI family of semiconductors, i.e. $Hg_{1-x}Cd_xTe$ and CdTe or $Cd_{1-y}Zn_yTe$, respectively. Inasmuch as the passivation layer 16 is preferrably formed by an epitaxial layer growth method a heterostructure is formed at the interface between the p-n junction 15 and the passivation layer 16. That is, the crystalline structure of the passivation layer 16 is substantially continuous with the crystalline structure of the underlying base and cap layers and has a wider bandgap than the underlying material. This crystalline continuity advantageously provides for a continuous extension of the bandgap structure of the HgCdTe layers 12 and 14, which have typical energy gaps of 0.1 to 0.3 eV, to the wider bandgap passivation layer 16. For example, CdTe has a bandgap of approximately 1.6 eV. This results in a bending of the conduction band in an upward direction thereby repelling electrons from the HgCdTe/CdTe interface. This wider bandgap further results in the valence band bending in a downwards direction, thereby repelling holes from the interface. This is shown in FIG. 2 and will be described in more detail hereinafter.

Referring once more to FIG. 1b the diode 10 may also comprise an overglass layer 18 which may be comprised of any suitable dielectric material such as $Si_3N_4$, $SiO_2$ or ZnS. Overglass layer 18 electrically isolates a metallic contact 20 from similar contacts on adjacent diodes. The contact 20 may be comprised of any suitable material which is operable for forming an ohmic contact to the HgCdTe cap layer 14. Preferably, the metal of metallic contact 20 does not diffuse significantly into the cap layer 14. Metals which are suitable for forming the contact 20 are palladium and titanium.

It has been found that the overglass layer 18 is optional in that the intrinsic resistance of the epitaxial CdTe passivation layer 16 is sufficiently high such that lateral shunting of adjacent photodiodes within an array of photodiodes does not occur. However, it has also been found that the presence of the overglass layer 18 is beneficial in that it serves as an additional barrier to the out diffusion of Hg from the underlying HgCdTe base and cap layers 12 and 14, respectively. This overglass barrier, in combination with the diffusion barrier provided by the contact metallization itself, serves to reduce Hg out diffusion such that the resulting photodiode structure may withstand higher temperatures than conventional devices.

In this regard it should be noted that the crystalline structure of the epitaxial passivation layer 16, at typical processing and storage temperatures, functions as a primary barrier to the out-diffusion of Hg from the HgCdTe layers; the additional barriers provided by the overglass layer 18 and contact 20 serving to supplement the passivation layer 16 barrier. It should also be noted that inasmuch as the mechanical properties of the crystalline structure of passivation layer 16 are superior to conventional passivation coatings that problems associated with porosity and lack of adhesion are overcome. FIG. 1c is a cross-sectional view of a top side illuminated planar photodiode 10' which is constructed in accordance with the invention. The photodiode 10' is illustrated with primed reference numerals to indicate equivalent structure and composition as the photodiode of FIG. 1b. That is, the photodiode 10' has a p-type HgCdTe radiation absorbing base layer 12', an n-type region 14', a p-n junction 15' and an epitaxial CdTe, CdZnTe or HgCdTe passivation layer 16'. An overglass layer 18' may be provided. Contact metallization 20' couples the photodiode 10' to external circuitry.

Referring now to FIG. 2 there is shown an idealized energy band diagram of the photodiode 10 of FIG. 1 wherein the wider bandgap passivation layer 16 is comprised of CdTe and wherein the narrower bandgap material comprises either the base HgCdTe layer 12 or the cap HgCdTe layer 14. As can be seen, there is shown a continuously varying potential energy in the conduction and valence bands such that the conduction band is bent upwards and the valence band is bent downwards. This results in the repulsion of both electrons and holes, respectively, from the HgCdTe/CdTe interface. This repulsion of both electrons and holes from the interface, wherein the relatively high density of lattice dislocations and impurities would otherwise cause excess surface state generation currents and a reduced charge carrier lifetime, results in the photodiode of the invention exhibiting superior performance over conventional $SiO_2$ passivated photodiodes.

Furthermore, if desired the upper surface of the CdTe passivation layer 16 may be doped to isolate charges on the CdTe surface from the underlying HgCdTe surface. In the diagram of FIG. 2 the upper surface of the CdTe passivation layer 16 has been doped with an n-type impurity. If desired, a p-type impurity may be employed instead. A typical doping concentration of the upper surface of the passivation layer 16 is approximately $10^{17}$ atoms/cm$^3$.

The utilization of, for example, $Cd_{(1-y)}Zn_yTe$ as the epitaxial surface passivation material has the additional advantage of lattice matching the passivation and underlying HgCdTe layers such that dislocations at the HgCdTe/CdZnTe interface are minimized. For example, y may be selected to have a value of approximately 0.4. As was previously discussed in relation to the CdTe passivated photodiode, the intrinsic resistance of the CdZnTe passivation makes the overglass layer 18 optional.

The passivation layer 16 may be epitaxially grown to a desired thickness on the photodiode by a vapor phase epitaxy (VPE) method, although a number of other suitable epitaxial layer formation methods may be employed, such as metalorganic chemical vapor deposition (MOCVD). In general, any epitaxial growth method may be employed which results in the crystalline order of the passivation layer 16 replicating the underlying crystalline order of the HgCdTe. After the growing of the layer 16, the devices may be processed by conventional methods to deposit the overglass layer 18 and contact metallization 20. During the growth of the epitaxial passivation layer 16 a suitable mask may be employed to prevent the growth of the epilayer upon the surface area of cap layer 14 wherein the contact metallization is to be deployed. Preferably, the entire surface of the cap layer 14 may have the passivation layer grown thereon, the passivation layer being selectively removed from the metallization area by a subsequent processing step.

Test structures were fabricated which comprised 5×5 arrays of photodiodes, gated and ungated variable area photodiodes and MIS capacitors, the photodiodes comprising both LWIR and MWIR HgCdTe radiation absorbing material. Certain of the test structures were fabricated with a layer of conventional $SiO_2$ passivation while others were fabricated with an epitaxially grown CdTe passivation. Certain other test structures were fabricated such that both CdTe and conventional $SiO_2$ passivation were employed upon the same HgCdTe wafer.

FIGS. 3, 4, 5, 6, and 7 show graphs and performance curves which illustrate the performance improvement of the photodiode devices which employ, in accordance with the invention, the epitaxial Group II–VI passivation layer 16. Specifically, FIGS. 3a–3d are performance curves of a CdTe passivated LWIR HgCdTe photodiode showing representative I–V curves at 80K, $R_oA$ vs. temperature, spectral response and a noise spectrum, respectively, while FIGS. 4a–4d shows a corresponding set of performance curves for a $SiO_2$ passivated LWIR HgCdTe photodiode of the prior art. FIGS. 5a and 5b show a comparison of I–V curves for a CdTe passivated and a conventional $SiO_2$ passivated MWIR photodiode, respectively, both being fabricated from different portions of the same HgCdTe wafer. FIGS. 6a–6c show a comparison of the $R_oA$ product as a function of storage temperature at 100° C. for CdTe and conventional $SiO_2$ LWIR large area, small area and 5×5 arrays, respectively, of HgCdTe photodiodes. FIGS. 7a and 7b show a comparison of surface recombination velocity (SRV) as a function of bake time at 100° C. for CdTe passivated and conventional $SiO_2$ passivated photodiodes, respectively.

As has been previously stated, presently preferred embodiments of the invention have herein been described. It is possible that those skilled in the art may derive modifications to these presently preferred embodiments based upon the foregoing disclosure. For example, although the presently preferred embodiments of the invention have been disclosed in the context of a mesa-type array of backside illuminated photovoltaic diodes it should be realized that the teachings of the invention also apply to frontside illuminated and to planar-types of photodiodes and, in general, to any type of Group II–VI photovoltaic or photoconductive devices. Thus, it should be understood that the invention is not to be limited to only the presently preferred embodiments disclosed above but is instead intended to be limited only as defined by the appended claims.

What is claimed is:

1. A photodiode comprising:
   a first, radiation absorbing, region for generating charge carriers from absorbed radiation, said radiation absorbing region comprising a Group II–VI material which has a first type of electrical conductivity;
   a second region in contact with said first region, said second region comprising a Group II–VI material which has an opposite type of electrical conductivity from said first region for forming a p-n diode junction therewith; and
   a third region overlying at least said p-n diode junction, said third region comprising an epitaxial layer comprised of a group II–VI material; and wherein
   said first and said second regions have a first and a second energy bandgap, respectively, and wherein said third region has a third energy bandgap which is wider than either said first or said second energy bandgaps.

2. A photodiode as defined in claim 1 wherein said first and said second regions are comprised of HgCdTe and wherein said third region is an epitaxial layer which is comprised of CdTe.

3. A photodiode as defined in claim 1 wherein said first and said second regions are comprised of HgCdTe and wherein said third region is an epitaxial layer which is comprised of CdZnTe.

4. A photodiode as defined in claim 1 wherein said first and said second regions are comprised of HgCdTe and wherein said third region is an epitaxial layer which is comprised of HgCdTe.

5. A photodiode as defined in claim 1 and further comprising a fourth region overlying said third region, said fourth region being comprised of a dielectric material.

6. An IR radiation responsive photodiode comprising:
   a first, radiation absorbing, layer having a surface for admitting IR radiation for generating charge carriers from absorbed IR radiation, said radiation absorbing layer comprising a Group II–VI material which has a first type of electrical conductivity;
   a second layer overlying a top surface of said first layer, said second layer also comprising a Group II–VI material which has an opposite type of electrical conductivity from said first layer for forming a p-n diode junction therewith;

a metallization layer being electrically coupled to said second layer for coupling charge carriers to a readout means; and a passivation layer overlying at least said p-n diode junction, said passivation layer comprising a Group II–VI material and forming a heterostructure with said underlying first and second layers; and wherein said first and said second layers have a first and a second energy bandgap, respectively, and wherein said passivation layer has a third energy bandgap which is wider than either of said first or said second energy bandgaps.

7. A photodiode as defined in claim 6 wherein said first and said second layers are comprised of HgCdTe and wherein said passivation layer is an epitaxial layer which is comprised of CdTe.

8. A photodiode as defined in claim 6 wherein said first and said second layers are comprised of HgCdTe and wherein said passivation layer is an epitaxial layer which is comprised of CdZnTe.

9. A photodiode as defined in claim 6 wherein said first and said second layers are comprised of HgCdTe and wherein said passivation layer is an epitaxial layer which is comprised of wider bandgap HgCdTe.

10. A photodiode as defined in claim 6 and further comprising a third layer overlying said passivation layer, said third layer being comprised of a dielectric material.

11. An array of IR radiation responsive photodiodes comprising:

a first, radiation absorbing, layer having a surface for admitting IR radiation for generating charge carriers from absorbed IR radiation, said radiation absorbing layer comprising a Group II–VI material which has a first type of electrical conductivity;

a plurality of mesa regions overlying a top surface of said first layer, each of said mesa regions also comprising a Group II–VI material which has an opposite type of electrical conductivity from said first layer for defining, at an interface region between each of said mesa regions and said first layer, a p-n diode junction; and a passivation layer overlying at least said interface regions, said passivation layer comprising a Group II–VI material being operable for forming a heterostructure with said interface regions; wherein said first layer and said plurality of mesa regions have a first and a second energy bandgap, respectively, and wherein said passivation layer has a third energy bandgap which is wider than either said first or said second energy bandgaps.

12. An array of photodiodes as defined in claim 11 wherein said first layer and said plurality of mesa regions are comprised of HgCdTe and wherein said passivation layer is an epitaxial layer which is comprised of CdTe.

13. An array of photodiodes as defined in claim 11 wherein said first layer and said plurality of regions are comprised of HgCdTe and wherein said passivation layer is an epitaxial layer which is lattice matched to said underlying mesa regions and to said first layer.

14. An array of photodiodes as defined in claim 13 wherein said epitaxial layer is comprised of CdZnTe.

15. An array of photodiodes as defined in claim 13 wherein said epitaxial layer is comprised of HgCdTe which has a wider bandgap than said mesa regions or said first layer.

16. An array of photodiodes as defined in claim 11 and further comprising a third layer overlying said passivation layer, said third layer being comprised of a dielectric material.

17. An array of IR radiation responsive photodiodes comprising:

a base layer having a surface for admitting IR radiation therein, said base layer being operable for absorbing IR radiation for generating charge carriers, said base layer comprising HgCdTe which has a first type of electrical conductivity;

a plurality regions formed within a top surface of said base layer, each of said regions comprising HgCdTe which has an opposite type of electrical conductivity from said base layer for defining a p-n diode junction at an interface between each of said regions and said base layer; and a passivation layer overlying at least said p-n diode junctions, said passivation layer comprising a Group II–VI material and forming a heterostructure with said underlying p-n diode junctions; wherein said base layer and said plurality of regions have a first energy bandgap and a second energy bandgap, respectively, and wherein said passivation layer has a third energy bandgap which is wider than either said first or said second energy bandgaps.

18. An array of photodiodes as defined in claim 17 wherein said passivation layer is an epitaxial layer which is comprised of CdTe.

19. An array of photodiodes as defined in claim 17 wherein said passivation layer is an epitaxial layer which is lattice matched to said underlying base layer and to said regions.

20. An array of photodiodes as defined in claim 19 wherein said epitaxial layer is comprised of CdZnTe.

21. An array of photodiodes as defined in claim 19 wherein said epitaxial layer is comprised of HgCdTe.

22. An array of photodiodes as defined in claim 17 and further comprising an overglass layer overlying said passivation layer, said overglass layer being comprised of a dielectric material.

23. An array of photodiodes as defined in claim 17 wherein a top surface of said passivation layer is doped to have a desired type of electrical conductivity.

24. An array of photodiodes as defined in claim 17 wherein said first and said second energy bandgaps are substantially equal one to another.

25. An array of photodiodes as defined in claim 17 wherein IR radiation is incident upon said top surface of said base layer, the radiation passing through said passivation layer.

26. An array of photodiodes as defined in claim 17 wherein IR radiation is incident upon a bottom surface of said base layer.

27. An array of IR radiation responsive photodiodes, each of the photodiodes comprising:

a radiation absorbing body comprised of HgCdTe having a first type of electrical conductivity and a first energy bandgap, said radiation absorbing body generating charge carriers in response to IR radiation absorbed therein;

a region comprised of HgCdTe in contact with said radiation absorbing body and having a second type of electrical conductivity for forming a p-n junction with said radiation absorbing body, said region having a second energy bandgap; and a layer comprised of a Group II–VI Cd compound having a bottom surface which overlies at least said p-n junction, said layer having a crystalline structure which is substantially continuous with a crystalline structure of both said radiation absorbing body and said region, said layer having an energy bandgap which is wider than either the first or the second energy bandgaps, said layer having a top surface portion which is doped with an impurity for substantially isolating any charges on the top surface of the layer from the underlying HgCdTe material.

28. An array of photodiodes as set forth in claim 27 wherein said layer is comprised of CdTe, CdZnTe, HgCdTe or combinations thereof.

29. An array of photodiodes as set forth in claim 28 wherein said layer has a thickness of approximately 5000 angstroms.

30. An array of photodiodes as set forth in claim 29 wherein said upper surface portion of said layer is doped with an impurity having a concentration of approximately $10^{17}$ atoms/cm$^3$.

* * * * *